(12) United States Patent
Funatsu

(10) Patent No.: US 6,303,196 B1
(45) Date of Patent: Oct. 16, 2001

(54) PELLICLE

(75) Inventor: Hiroyuki Funatsu, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/416,062

(22) Filed: Oct. 12, 1999

(30) Foreign Application Priority Data

Oct. 13, 1998 (JP) .................................................. 10-290510

(51) Int. Cl.[7] .................................................. G03F 9/00
(52) U.S. Cl. .................................................. 428/14; 430/5
(58) Field of Search .................................. 428/14; 430/5

(56) References Cited

U.S. PATENT DOCUMENTS 5,820,950 * 10/1998 Wang .................................. 428/14

* cited by examiner

Primary Examiner—Alexander S. Thomas
(74) Attorney, Agent, or Firm—Rabin & Berdo, P.C.

(57) ABSTRACT

A pellicle that prevents adhesion of an adhesive pushed out from a pellicle frame to an original circuit pattern of a mask when mounting the pellicle to the mask. An end surface of the pellicle frame to be fixed to the mask has a taper-shaped notch formed by notching a rim along the entire peripheral surface of the pellicle frame in the peripheral direction. The adhesive is applied to the notch.

5 Claims, 4 Drawing Sheets

PRESSING FORCE
TO A PELLICLE

PRESSING FORCE TO A PELLICLE

EXPOSURE LIGHT

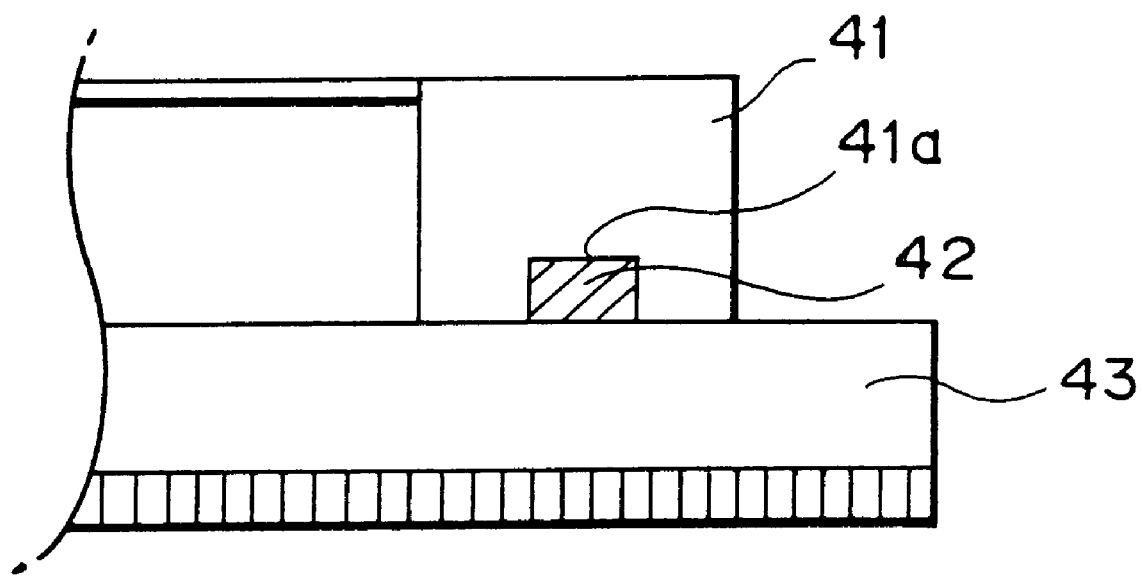

PELLICLE

BACKGROUND OF THE INVENTION

1. Field of the Invention

The present invention relates to a pellicle which is bonded to a mask used in a photolithography process to protect the mask which process is a part of method for semiconductor integrated circuit fabrication.

2. Description of the Related Art

A mask is an original plate of a circuit pattern used for the transfer of a circuit pattern of a semiconductor integrated circuit onto a wafer, that is, the mask is a glass substrate having an original circuit pattern fabricated of opaque thin membrane formed thereon. To transfer the circuit pattern onto the wafer, the mask is set above a wafer, then ultra violet light, X-rays or the like are irradiated onto the mask.

When foreign matter such as dust is adhering to the mask, the exact shape of the shadow of the foreign matter is transferred onto the wafer. Subsequently, defects are made in the circuit pattern transferred onto the wafer, resulting in a lowering of the reliability of the semiconductor integrated circuit. To prevent adhesion of foreign matter like this to the mask, a structure having a transparent protective membrane, called a pellicle, is mounted to the mask surface.

FIG. 3 is a partially sectional view showing a structure of a conventional pellicle. As shown in FIG. 3, a pellicle 30 comprises a pellicle membrane 31 which is a protective membrane fabricated from a transparent member, a pellicle frame 32 to hold the pellicle membrane 31 at a predetermined distance away from a surface of a mask 34, and an adhesive 33 to fix the pellicle frame 32 to the surface of the mask 34. The pellicle membrane 31 is fabricated from a transparent thin membrane formed from nitrocellulose or the like, and prevents adhesion of foreign matter from outside onto the surface of the mask 34 by being fixed at a predetermined distance away from the surface of the mask. Even when foreign matter does adhere to the pellicle membrane 31, the shadow of the foreign matter is not transferred onto the wafer because the shadow of the foreign matter adhering to the pellicle membrane 31 is out of focus during exposure of the wafer since the pellicle membrane 31 and the mask 34 are spaced apart.

To mount this type of pellicle 30 to the mask 34, first, a side of the pellicle 30 with the adhesive 33 applied thereto and a surface of the mask 34 having an original circuit pattern formed thereon, are positioned face-to-face. Then, the pellicle 30 is press-adhered to the mask 34 by the application of a force against the mask 34 from above the pellicle 30.

However, when this type of pellicle 30 is fixed to the mask, the adhesive 33 is squeezed out due to the pressure applied to the pellicle 30, and a part of the adhesive 33 from an end surface of the pellicle frame 32 adheres to the surface of the mask on the inside and outside of the pellicle frame 32. FIG. 4 is a schematic sectional view showing the squeezed adhesive 33' adhering to the surface of the mask 34 inside the pellicle frame 32. The adhesive 33' adhering to the surface of the mask 34 inside the pellicle frame 32, as shown in FIG. 4, deteriorates due to exposure to the light from an exposure apparatus and loses its tackiness, and may move near to the original pattern of the mask due to vibration during transportation of the mask or the like. The problem has arisen that this deteriorated adhesive 33' causes defects in the mask 34 by adhering to the original pattern of the mask 34.

In order to solve this type of problem, the technology described in Japanese Patent Application Laid-Open (JP-A) No. 6-19124 provides a pellicle such as that shown in FIG. 5 (FIG. 5 shows a pellicle which is mounted to the opposite surface of the mask to that in FIG. 4). A groove 41a is formed on an end surface of a pellicle frame 41 facing a mask 43, and a pellicle is fixed to the mask 43 by an adhesive with which the groove 41a is filled. By utilizing this structure, bleeding of the adhesive onto the mask 43 inside the pellicle frame 41 is prevented.

However, in the pellicle structure described in the aforementioned JP-A-No. 6-19124, the problem has been that it is difficult to adjust the amount of the adhesive 42 to be placed in the groove 41a. For example, too small an amount of the adhesive 42 makes it difficult to sufficiently fix the pellicle on the surface of the mask 43 because the adhesive 42 is not able to fully contact the mask 43. On the other hand, too large an amount of the adhesive 42 causes problems with the adhesive 42 being pushed out all over the end surface of the pellicle frame 41 from the groove 41a upon pressing the pellicle against the mask 43, and the pushed-out adhesive 42 adheres to the mask 43 on the inside and outside of the pellicle frame 41. There has been a further problem that when the adhesive 42 is placed in the groove 41a like this, the bonding area of the mask 43 and the adhesive 42 in the state shown in FIG. 5 is too small for a sufficient bond strength to be obtained.

The aim of the present invention, therefore, is to provide a pellicle which does not cause lowering of reliability of the mask due to the adhesion of adhesive pushed out from a pellicle frame to a surface of a mask when fixing the pellicle to the mask.

SUMMARY OF THE INVENTION

The pellicle of the present invention is a pellicle stretched between a predetermined position and a surface of a mask, on the surface of which is formed an original pattern for transferring a circuit pattern onto a wafer using a photolithographic method, in order to prevent the adhesion of foreign matter to the original pattern formed on the surface of the mask, wherein the pellicle is provided with a pellicle frame. The pellicle includes a pellicle membrane that is transparent to exposure light, and a frame-shaped structure. The frame structure has a surface at a first end adhering to the periphery of the pellicle membrane and a surface of a second end adhering to the mask. The frame also has a notch portion running in the peripheral direction of the surface at the second end surface for allowing adhesive used during an adhesion process to escape in the peripheral direction.

Namely, the pellicle of the present invention has a notch formed along the peripheral direction of a surface of the pellicle frame, which surface is to be bonded to the mask. By applying the adhesive to the notch, the adhesive can be released to the outside when mounting the pellicle to the mask, so that adhesion of the adhesive to the original pattern of the mask can be prevented.

When adopting a pellicle with this type of structure, the notch may be a tapered surface that is sloped at a predetermined angle to the mask. Also, the notch may be shaped so as to have an arcuate sectional form.

When adopting a pellicle with this type of structure, said notch may be a tapered surface which is sloped at a predetermined angle to said mask. Also, the notch may be shaped so as to have an arcuate sectional form.

BRIEF DESCRIPTION OF THE DRAWINGS

FIG. 5 is a partially sectional view showing a structure of a pellicle described in JP-A No. 6-19124.

DETAILED DESCRIPTION OF THE INVENTION

Embodiments of the present invention are explained below with reference to the figures.
(First Embodiment)

Figure 1A:
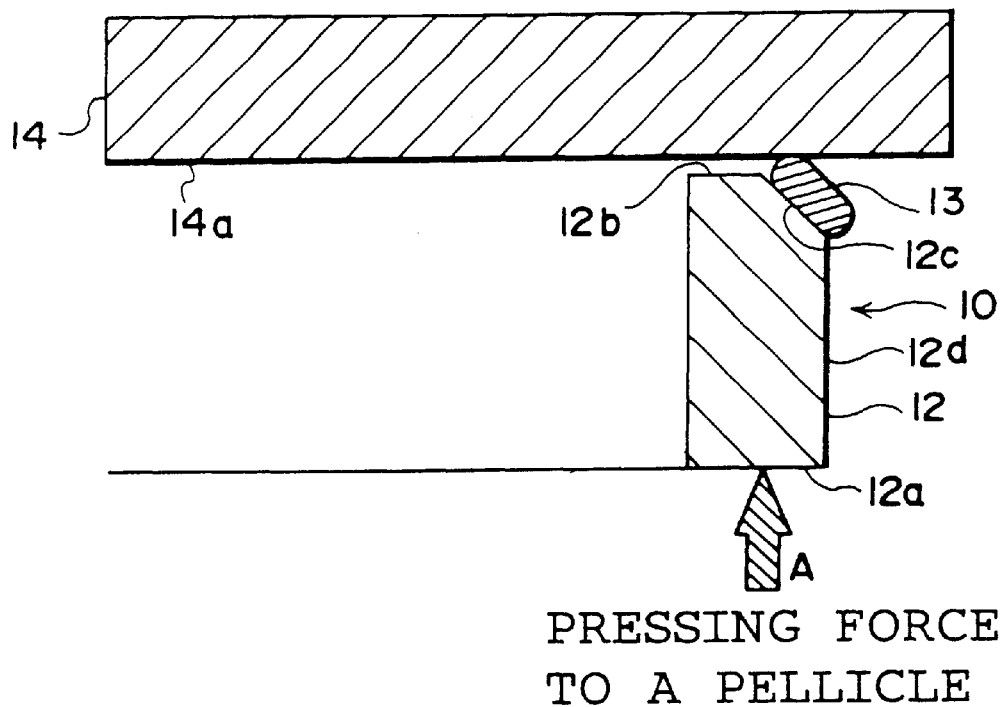
FIGS. 1A and 1B are partially sectional views showing a structure of a pellicle according to a first embodiment of the present invention.
Figure 1B:
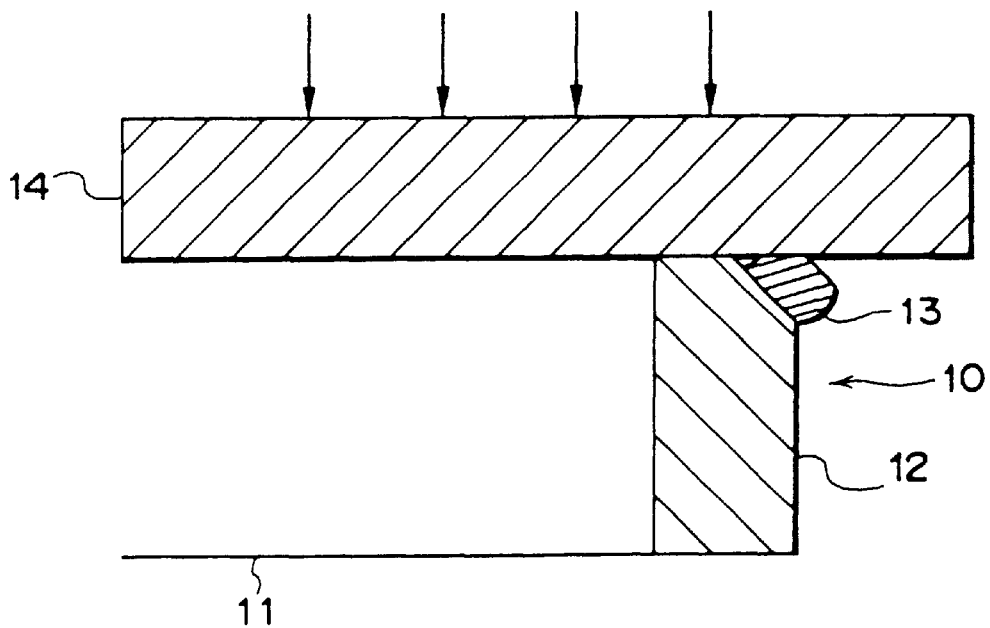

FIG. 1A is a partially sectional view showing a structure of a pellicle according to a first embodiment of the present invention, and FIG. 1B is a sectional view showing the pellicle of FIG. 1A being mounted to a mask. A pellicle 10 of the present embodiment comprises a pellicle membrane 11, which is a protective membrane fabricated from a transparent member, a pellicle frame 12 to hold the pellicle membrane 11 a predetermined distance away from a mask 14, and an adhesive 13 applied to an end surface of the pellicle frame 12 to fix the pellicle frame 12 to the mask 14.

The pellicle frame 12 is a frame fabricated from an aluminum alloy or the like, having a periphery smaller than the periphery of the mask 14. One end surface of the pellicle frame 12 is bonded to a surface of the pellicle membrane 11 near the membrane periphery. The pellicle membrane 11 is a transparent thin membrane fabricated of nitrocellulose or the like and the thickness thereof is about 0.8 $\mu$m. A rim along a peripheral surface 12d of another end surface 12b of the pellicle frame 12 is notched in a tapered-shape throughout the periphery of the end surface 12b so as to have an angle of 45° to the end surface 12b. Hereinafter, this sloped portion is designed as a notch 12c. The adhesive 13 is applied to the entire surface of the notch 12c.

A method of mounting a pellicle 10 having this type of structure to the mask 14 is explained below. First, as a shown in FIG. 1A, the surface of the pellicle 10 with the adhesive 13 applied thereto is positioned to face a surface 14a of the mask 14 on which an original circuit pattern (not shown) is formed. Then pressure against the pellicle 10 from the pellicle membrane 11 side is applied in a direction A of FIG. 1A to press-adhere the end surface 12b of the pellicle frame against the surface 14a of the mask 14. Thus, as shown in FIG. 1B, the end surface 12b of the pellicle frame 12 is fixed to the mask 14 by the adhesive 13 applied to the notch 12c closely contacting the mask 14. By mounting the pellicle 10 to the mask 14 in this way, the original circuit pattern formed on the surface 14a of the mask 14 is covered by the pellicle 10, and thereby adhesion of foreign matter onto the mask 14 can be prevented. In the state shown in FIG. 1B, even when foreign matter adheres to the pellicle membrane 11, the shadow thereof is not transferred onto a wafer because the foreign matter is out of focus during exposure since the pellicle membrane 11 is spaced a predetermined distance away from the surface of the mask 14.

To mount the pellicle 10 to the mask 14, a pressure of about 30 kg/cm$^2$ is applied to the pellicle 10. Therefore, the adhesive 13 applied to the pellicle frame 12 is squeezed by the pressure and may spread around the pellicle frame 12. Even in a case like this, the adhesive 13 only spreads outward from the pellicle 10 along the notch 12c since the adhesive 13 is applied only to the notch 12c, which is sloped with respect to the end surface 12b. Thus, adhesion of the spread adhesive 13 onto the portion of the original circuit pattern of the mask 14 inside the pellicle frame 12 can be prevented. Thus, defects in the mask caused by adhesion onto the original circuit pattern of the adhesive, which has lost its tackiness due to exposure to an exposure light, can be prevented.

Figure 2A:
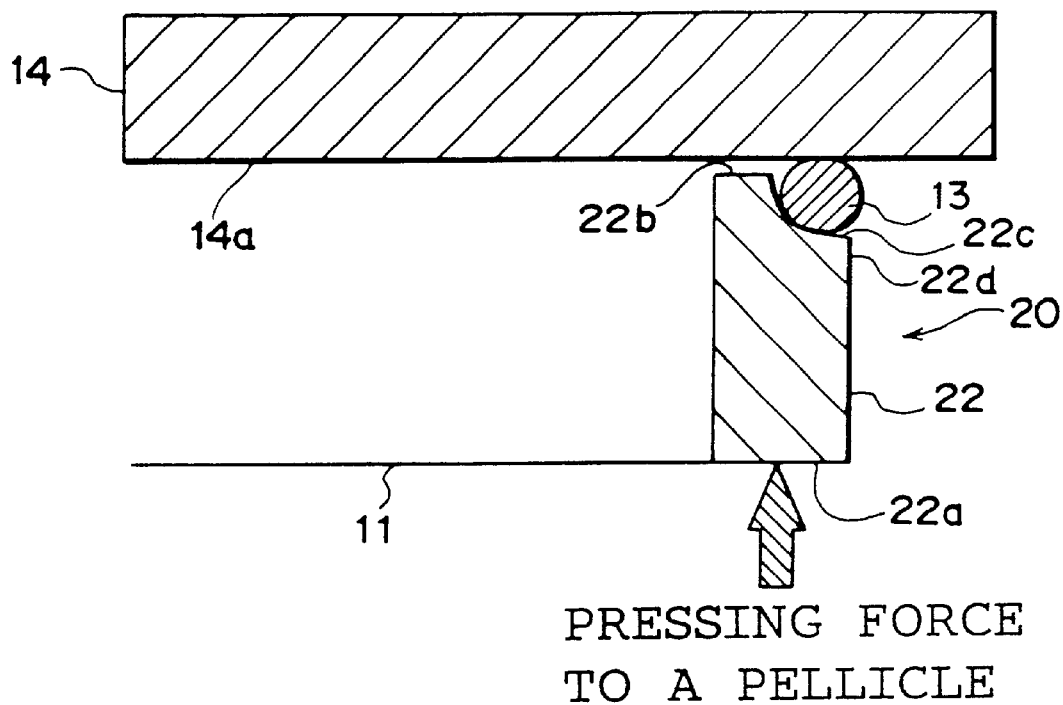
FIGS. 2A and 2B are partially sectional views showing a structure of a pellicle according to a second embodiment of the present invention.
Figure 2B:
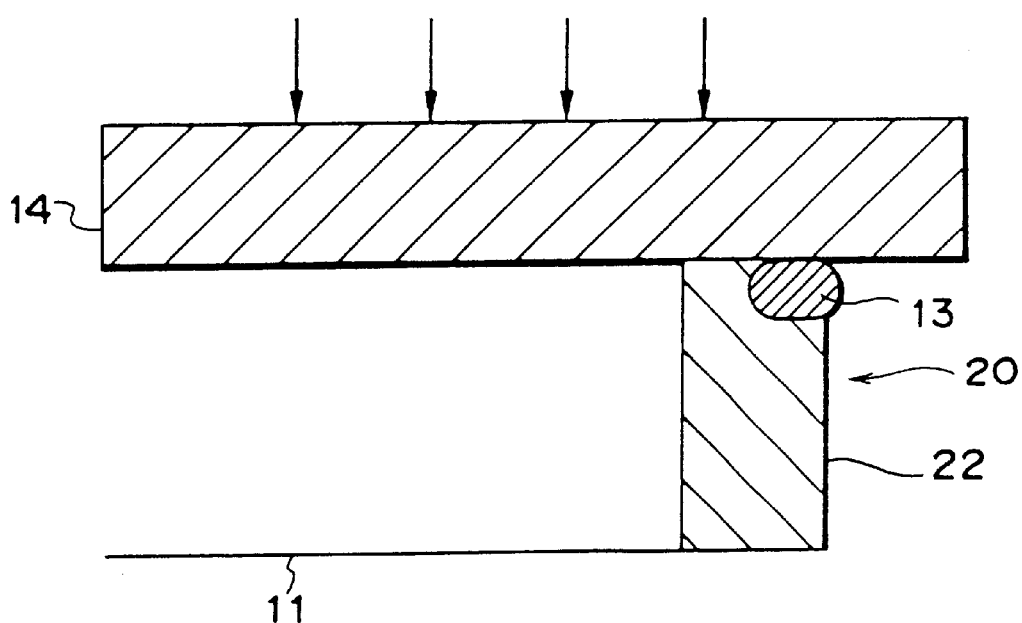
Figure 3:
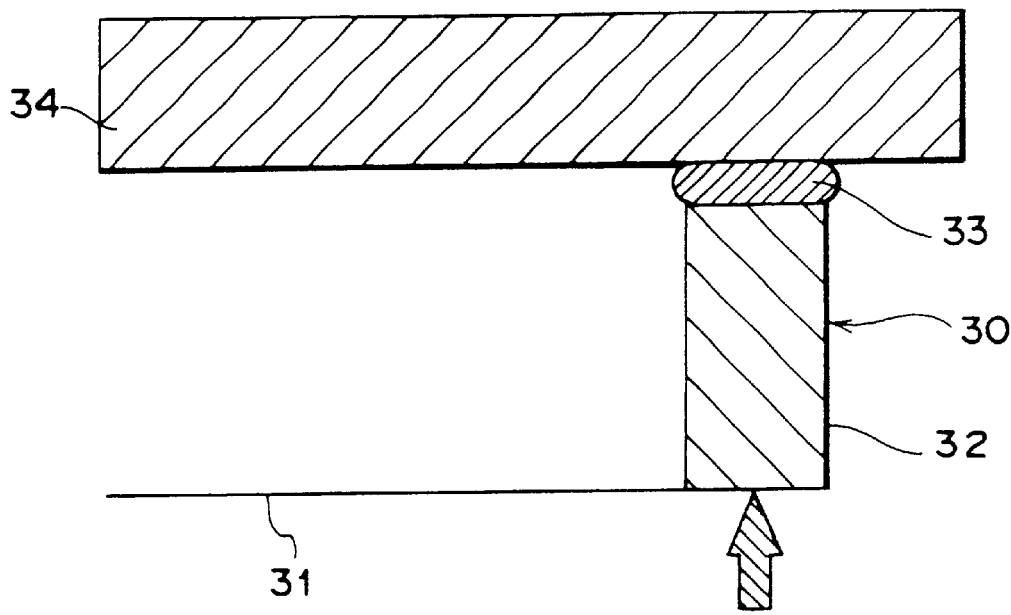
FIG. 3 is a partially sectional view showing a structure of a pellicle according to a conventional technique.
Figure 4:
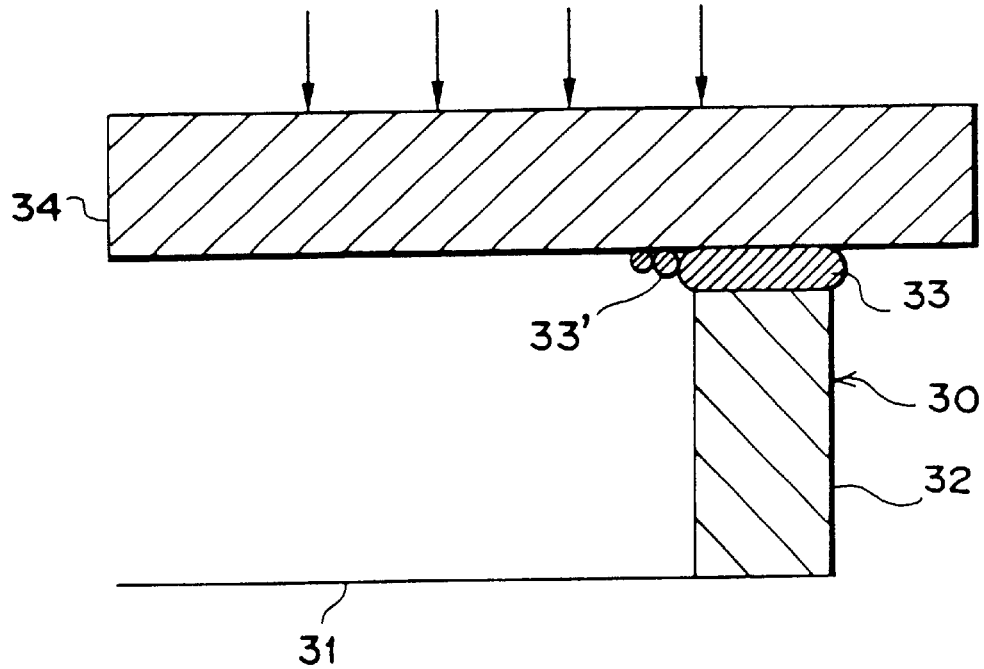
FIG. 4 is a schematic sectional view for the purpose of explaining a problem in the conventional technique.

FIG. 2A is a sectional view showing a structure of a pellicle according to a second embodiment of the present invention, and FIG. 2B is a sectional view showing the pellicle of FIG. 2A being mounted to a mask. The pellicle according to the second embodiment is characterized by an adhesive application surface formed by notching a rim, along the periphery of an end surface of a pellicle frame, to have an arcuate sectional form. Other portions of the pellicle are the same as the pellicle of the first embodiment.

A pellicle membrane 11 is bonded to an end surface 22a of a pellicle frame 22 of the pellicle 20 in the same way as in the first embodiment. A rim along a peripheral surface 22d of another end surface 22b of the pellicle frame 22 is notched so as to have an arcuate sectional form, as shown in FIG. 2A. An adhesive 13 for fixing the pellicle 20 to a mask 14 is applied to the entire adhesive application surface 22c formed by notching the rim of the pellicle frame 22b.

To mount the pellicle having this type of structure onto the mask 14, pressure is applied to the pellicle 20 to press-adhere the pellicle 20 against the mask 14 in the same way as in the first embodiment. Thus, the pellicle frame 22 is fixed to the mask 14 by the adhesive 13. At this time, the adhesive 13 is squeezed by the pressure applied to the pellicle 20, and a part of the adhesive 13 may spread around the pellicle frame 22. However, in the pellicle 20 of the present embodiment, the adhesive 13 is spread outward only from the pellicle 20 because the adhesive 13 is applied only to the adhesive application surface 22c formed by notching the end surface 22b of the pellicle frame 22. Thus, adhesion of the adhesive 13 to the original circuit pattern (not shown) formed on the surface of the mask inside the pellicle frame 22, can be prevented, and thereby the occurrence of defects in the mask can be prevented.

According to the present invention, the adhesion of an adhesive pushed out of a pellicle frame onto a surface of a mask inside the pellicle frame when mounting a pellicle to the mask can be prevented.

What is claimed is:

1. A pellicle stretched between a predetermined position and a surface of a mask, on the surface of which is formed an original pattern for transferring a circuit pattern onto a wafer using a photolithographic method, in order to prevent adhesion of foreign matter to the original pattern formed on the surface of the mask, the pellicle including a pellicle frame, the pellicle frame including a pellicle membrane that is transparent to exposure light, and a frame-shaped structure having a first end surface at one end adhering to the periphery of the pellicle membrane and a second end surface at another end adhering to the mask, and which also has a notch portion running in the peripheral direction of the second end surface for allowing adhesive used during an adhesion process to escape in the peripheral direction.

2. A pellicle according to claim 1, wherein the notch is a tapered surface that is sloped at a predetermined angle to the surface of the mask.

3. A pellicle according to claim 2, wherein the notch is formed across the entire periphery of the pellicle frame.

4. A pellicle according to claim 1, wherein the notch is shaped so as to have an arcuate sectional form.

5. A pellicle according to claim 4, wherein the notch is formed across the entire periphery of the pellicle frame.

* * * * *